United States Patent [19]

Maeno et al.

[11] Patent Number: 4,950,547
[45] Date of Patent: Aug. 21, 1990

[54] MAGNETO-OPTICAL RECORDING MEDIUM HAVING PROTECTIVE FILM WITH INCREASED KERR EFFECT AND IMPROVED PROTECTION CHARACTERISTIC AND MANUFACTURING METHOD OF THE SAME

[75] Inventors: Yoshinori Maeno; Masanobu Kobayashi; Kayoko Oishi, all of Tokyo, Japan

[73] Assignee: Oki Electric Industry Co., Ltd., Tokyo, Japan

[21] Appl. No.: 376,591

[22] Filed: Jul. 7, 1989

[30] Foreign Application Priority Data

Jul. 8, 1988 [JP] Japan .................. 63-170567
Mar. 2, 1989 [JP] Japan .................... 1-50467

[51] Int. Cl.$^5$ .......................... B32B 9/00; G11B 5/66
[52] U.S. Cl. .................... 428/471; 428/694; 428/697; 428/702
[58] Field of Search ........... 428/471, 694, 697, 702; 430/945; 360/13; 369/131

[56] References Cited

U.S. PATENT DOCUMENTS

| 4,578,729 | 3/1986 | Suzuki et al. | 360/134 |
| 4,656,088 | 4/1987 | Tokunaga et al. | 428/323 |
| 4,828,899 | 5/1989 | Arioka et al. | 428/143 |
| 4,835,032 | 5/1989 | Arioka et al. | 428/143 |
| 4,837,116 | 6/1989 | Arioka et al. | 428/141 |

FOREIGN PATENT DOCUMENTS 248130 10/1987 Japan .
289918 12/1987 Japan .

OTHER PUBLICATIONS

"Hikarijiki Disk", supervised by Nobutake Imamura & published by Triceps Co., Ltd., in Japan on Feb. 20, 1986, referred to on p. 2 of the specification.

"Theory of Yuudentairon", written by Shoten Oka & published by Gendai Kohgakusha, in Japan on May 15, 1977, referred to on p. 72 of the specification.

"Kerr-Effect Enhancement and Improvement of Readout Characteristics in MnBi Film Memory", J. Appl. Phys., vol. 45, No. 8, Aug. 1974.

Primary Examiner—George F. Lesmes
Assistant Examiner—Dennis V. Carmen
Attorney, Agent, or Firm—Wenderoth, Lind & Ponack

[57] ABSTRACT

A magneto-optical recording medium includes one selected from a compound of strontium titanate ($SrTiO_x$), a compound of barium titanate ($BaTiO_x$), a nitrogen compound of strontium titanate ($SrTiO_xN_y$), and a nitrogen compound of barium titanate ($BaTiO_xN_y$). The magneto-optical recording medium has a large value for the refractive index n and a small value for the extinction coefficient k; moreover, the medium is resistive against corrosions. For the magneto-optical recording medium, there is produced a protective film by simultaneously sputtering a film forming target and a composition adjusting target. The deposition of the protective film is achieved in a mixed atmosphere of an inert gas and oxygen or in a mixed gas of an inert gas and nitrogen.

3 Claims, 5 Drawing Sheets

Fig. 6

| | PROTECTIVE FILM | | COATING ATMOSPHERE (%) | | CHARACTERISTICS OF MAGNETO-OPTICAL RECORDING MEDIUM | | |
|---|---|---|---|---|---|---|---|
| | MATERIAL CONSTITUTION | | | | C/N RATIO (dB) | CORROSION RESISTIVITY TEST (HOURS) | COMPLEX REFRACTIVE INDEX n−ki |
| | FILM FORMING TARGET | COMPOSITION ADJUSTING TARGET | ARGON | OXYGEN | | | |
| COMPARISON EXAMPLE | SiO | ― | 100 | 0 | 44.0 | 200 OR MORE | 1.90 − 0.10 i |
| EMBODIMENT 1 | SrTiO3 | ―*1 | 100 | 0 | 47.5 | 200 OR MORE | 2.22 − 0.02 i |
| EMBODIMENT 2 | SrTiO3 | Ti | 100 | 0 | 46.8 | 200 OR MORE | 2.23 − 0.03 i |
| EMBODIMENT 3 | SrTiO3 | TiO | 100 | 0 | 47.5 | 200 OR MORE | 2.22 − 0.02 i |
| EMBODIMENT 4 | SrTiO3 | TiO2 | 100 | 0 | 47.0 | 200 OR MORE | 2.21 |
| EMBODIMENT 5 | BaTiO3 | ―*1 | 100 | 0 | 48.0 | 200 OR MORE | 2.25 − 0.02 i |
| EMBODIMENT 6 | BaTiO3 | Ti | 100 | 0 | 47.0 | 200 OR MORE | 2.27 − 0.02 i |
| EMBODIMENT 7 | BaTiO3 | TiO | 100 | 0 | 48.0 | 200 OR MORE | 2.25 − 0.02 i |
| EMBODIMENT 8 | BaTiO3 | TiO2 | 100 | 0 | 47.5 | 200 OR MORE | 2.21 |
| EMBODIMENT 9 | BaTiO3, SrTiO3 | ―*1 | 100 | 0 | 48.0 | ―*2 | 2.24 − 0.02 i |
| EMBODIMENT 10 | BaTiO3, SrTiO3 | Ti | 100 | 0 | 47.0 | ―*2 | 2.26 − 0.03 i |
| EMBODIMENT 11 | BaTiO3, SrTiO3 | TiO | 100 | 0 | 48.0 | 1000 OR MORE | 2.24 − 0.02 i |
| EMBODIMENT 12 | BaTiO3, SrTiO3 | TiO2 | 100 | 0 | 48.2 | 1000 OR MORE | 2.22 |
| EMBODIMENT 13 | SrTiO3 | ―*1 | 80 | 20 | 47.6 | ―*2 | 2.22 |
| EMBODIMENT 14 | BaTiO3 | ―*1 | 80 | 20 | 47.5 | ―*2 | 2.21 |
| EMBODIMENT 15 | BaTiO3, SrTiO3 | ―*1 | 80 | 20 | 48.1 | ―*2 | 2.23 |
| EMBODIMENT 16 | SrTiO3 | Ti | 80 | 20 | 47.5 | 200 OR MORE | 2.23 |
| EMBODIMENT 17 | BaTiO3 | Ti | 80 | 20 | 47.0 | 200 OR MORE | 2.25 |
| EMBODIMENT 18 | BaTiO3, SrTiO3 | Ti | 80 | 20 | 47.9 | ―*2 | 2.24 |

MAGNETO-OPTICAL RECORDING MEDIUM HAVING PROTECTIVE FILM WITH INCREASED KERR EFFECT AND IMPROVED PROTECTION CHARACTERISTIC AND MANUFACTURING METHOD OF THE SAME

BACKGROUND OF THE INVENTION

1. Field of the Invention

The present invention relates to an magneto-optical recording medium, and in particular, to a magneto-optical recording medium having a protective film with an increased Kerr effect enhancement and an improved protection characteristic.

2. Description of the Prior Art

For magneto-optical recording media, there have been powerfully conducted researches and developments to implement high-density recording media having a magnetic film and being capable of rewriting data recorded thereon.

Among magneto-optical recording substances employed to constitute s magnetic film for such a recording medium, an amorphous alloy comprising a rare-earth metal and a transition metal (to be simply referred to as an RE-TM alloy herebelow) has such features that there is attained a vertical magnetization film, namely, a direction of magnetization thereof is vertical to a film growth plane, that there is developed a large coersive force of several units of KOe, and that the film can be manufactured in a relatively easy fashion by use of a sputtering technology, a vaporized evaporation, or other deposition technology. In this regard, consequently, the research and development has been greatly advanced for the RE-TM alloy, which hence has been put broadly to practical uses.

However, a magnetic film formed with an RE-TM alloy is weak against corrosive actions (reference is to be made to description in page 427 of "Hikarijiki Disk" supervised by Nobutake Imamura and published from Triceps Co., Ltd.); moreover, the magnetic film is attended with a disadvantage that there is not attained a satifactorily great the magneto-optic Kerr effect.

To overcome this difficulty, there has been known a film structure in which a magnetic film formed with an RE-TM alloy is placed between protective films including various materials so as to prevent corrosions of the magnetic film and to increase the virtual rotation angle associated with the Kerr effect by use of a multi-reflection of a light (reference is made also to description in page 119 of the article above written by Imamura et al.)

As can be understood from the description of the prior art technology above, in the magneto-optical recording medium, a refractive index and a transmittivity of light through the a protective film exert a great influence on characteristics associated with information write and read operations. As for the refracive index, for example, a protective material mainly including aluminum such as AlN, AlSiN, or AlSiON has a refractive index n of about two and hence has been known as a material developing a relatively high index value among the substances heretofore reported. At present, however, with development of various information apparatuses, there has been required an improvement in the recording density, which leads to a problem that the refractive index developed by such a protective film material of the prior art technology cannot attain a satisfactory Kerr effect enhancement.

Furthermore, as described above, for the protective film formed on a read side of the magnetic film, it is required that there is developed a small extinction coefficient k with respect to wavelength adopted in the information write and read operations. The extinction coefficient k is attained as an complex refractive index n–ki (i is an imaginary unit) including the refractive index n. In actual, the extinction coefficient k takes a value of about $10^{-1}$ in the known protective film materials; however, it is desirable to develop a further reduced value.

As a problem in this situation, there has not been produced a protective film material which satisfies the requirements related to the refractive index n and the extinction coefficient k and which is satisfactorily resistive against corrosions.

SUMMARY OF THE INVENTION

It is therefore an object of the present invention to provide a magneto-optical recording medium having a high reliability and having a protective film satisfying the various requirements above and a suitable method of manufacturing the medium, thereby solving the problems of the prior art technology.

In order to achieve the object above, in accordance with the present invention, there is provided a magneto-optical recording medium at least including a protective film and a magnetic film disposed on a substrate in which the protective film is formed with at least one selected from a compound of strontium titanate ($SrTiOx$), a compound of barium titanate ($BaTiOx$), a nitride of strontium titanate ($SrTiOxNy$), and a nitride of barium titanate ($BaTiOxNy$).

In addition, according to the present invention, there is provided a method of manufacturing a magneto-optical recording medium at least including a protective film and a magnetic film disposed on a substrate comprising a step for manufacturing a protective film by simultaneously sputtering a film forming target comprising at least one selected from strontium titanate ($SrTiO_3$) and barium titanate ($BaTiO_3$) and a composition adjusting target including titanium (Ti) or titanium oxide ($TiOy$; Y is a positive number).

Furthermore, according to the present invention, there is provided a method of manufacturing a magneto-optical recording medium at least including a protective film and a magnetic film disposed on a substrate comprising a step for manufacturing a protective film by sputtering a film forming target comprising at least one selected from strontium titanate ($SrTiO_3$) and barium titanate ($BaTiO_3$) in an atmosphere produced by mixing an insert gas with oxygen or nitrogen.

In addition, according to the present invention, there is provided a method of manufacturing a magneto-optical recording medium at least including a protective film and a magnetic film disposed on a substrate comprising a step for manufacturing a protective film by simultaneously sputtering a film forming target comprising at least one selected from strontium titanate ($SrTiO_3$) and barium titanate ($BaTiO_3$) and a composition adjusting target including titanium (Ti) or titanium oxide ($TiOy$; Y is a positive number) in an atmosphere produced by mixing an insert gas with oxygen.

In the manufacturing methods above, the film forming target including strontium titanate and barium titanate comprehensively represents a case where the film is formed as a mixed crystal of these two substances and a case where there are employed at the same time two kinds of film forming targets respectively manufactured with the substances.

In the magneto-optical recording medium according to the present invention, with a provision of the recording medium configured with the protective film materials above, there are attained a refractive index n of at least 2.2 and a extinction coefficient k of at most 0.03 and in addition, the recording medium has an increased resistivity against corrosions as compared with the conventional materials.

Furthermore, in the method of producing the the magneto-optical recording medium according to the present invention, as described above, the protective film is formed by simultaneously sputtering the film forming target and the composition adjusting target, which enables a high refractive index and a low extinction coefficient to be attained and which further prevents the corossive resistivity of the medium from being deteriorated. In particular, it is possible to reduce the extinction coefficient k to 0 by increasing the ratio of the oxygen contained in the composition adjusting target, and hence there can be implemented a protective film which is substantially transparent with respect to the light.

Although the action conducted in the manufacturing method above is not clearly understood, it is considered that utilization of the composition adjusting target thus configured compensates for a stoichiometrical difference between the material constituting the film forming target and the material deposited as the protective film.

Furthermore, in the method of producing the the magneto-opticcal recording medium according to the present in vention, as described above, the protective film is formed by sputtering only the film forming target in an atmosphere of a mixture including an inert gas and oxygen, which enables a high refractive index and a low extinction coefficient to be attained and which further prevents the corrosion resistivity of the medium from being decreased. In particular, it is possible to reduce the extinction coefficient k to 0 by increasing the ratio of the oxygen contained in the composition adjusting target, and hence there can be implemented a protective film which is substantially transparent with respect to the light.

In addition, in the method of fabricating the the magneto-opticcal recording medium according to the present invention, as described above, the protective film is formed by simultaneously sputtering the film forming target and the composition adjusting target in an atmosphere of a mixture including, for example, an inert gas and oxygen, which enables a high refractive index and a low extinction coefficient to be attained and which further prevents the corossive resistivity of the medium from being deteriorated. According to this method, like in the case of the methods above, it is possible to reduce the extinction coefficient k to 0 by increasing the ratio of the oxygen contained in the composition adjusting target or the ratio of oxygen in the mixture atmosphere, and hence there can be implemented a protective film which is substantially transparent with respect to the light.

Moreover, in the method of producing the the magneto-opticcal recording medium according to the present invention, as described above, the protective film is formed by sputtering the film forming target and the composition adjusting target in an atmosphere of a mixture including, for example, an inert gas and nitrogen, which enables a high refractive index to be developed by the protective film and which further prevents the corossive resistivity of the magneto-optical recording medium from being deteriorated.

BRIEF DESCRIPTION OF THE DRAWINGS

The objects and features of the present invention will become more apparent from the consideration of the following detailed description taken in conjunction with the accompanying drawings in which:

FIG. 6 is a schematic diagram showing result of comparison effected between the embodiment according to the present invention and a comprison example.

DESCRIPTION OF THE PREFERRED EMBODIMENTS

Rreferring now to the accompanying drawings, description will be given of an embodiment according to the present invention.

Figure 1:
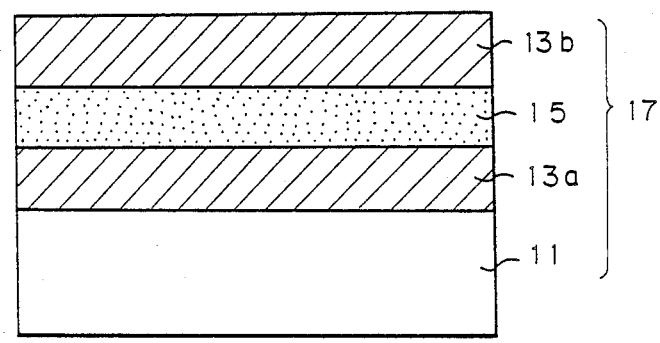
FIG. 1 is a schematic cross-sectional diagram showing an embodiment of the magneto-optical recording medium according to the present invention.

FIG. 1 is a schematic cross-sectional diagram useful for understanding a configuration example of a recording medium having a protective film according to the present invention.

As can be seen from the sturcture of FIG. 1, there is formed a recording medium 17 by sequentially manufacturing a protective film 13a, a magnetic film 15, and a protective film 13b on a surface of a substrate 11.

Of these constituent elements, the substrate 11 is formed in a shape of a disk by use of a polycarbonate resin, a glass, an epoxy resin, or other arbitrary suitable material.

Furthermore, the protection films 13a and 13b are manufactured by effecting a depositing with a material such as a compound of strontium titanate ($SrTiO_x$), a compound of barium titanate ($BaTiO_x$), a nitrogen compound of strontium titanate ($SrTiO_xN_y$), a nitrogen compound of barium titanate ($BaTiO_xN_y$) or a mixed crystal of materials selected from said materials. The depositing operation of the protective films are carried out, for example, by means of a sputtering, a vaporized evaporation, or other deposition technology suitable for the material constituting the protective films.

In addition, the magnetic film 15 includes an RE-TM alloy described above. As such alloys, there have been known, for example, a Tb-Fe alloy, a Tb-Co alloy, a Tb-Fe-Co alloy, and alloys comprising various combinations of rare-earth metals and transition metals.

In the recording medium 17 having the structure above, the protective film 13a disposed on a read side of the medium 17 is an element which exerts influence on a carrier to noise (C/N) ratio and hence is required to satisfy the following conditions.

(1) In order to increase the virtual value of the Kerr rotation angle, the protective film is to be formed with a material having a large refractive index.

(2) The protective film is to be formed with a material having a transparency with respect to a light in a wavelength employed for the write and read operations (ranging from 750 nanometers to about 900 nanometers in an ordernary case).

(3) The protective film is to be formed with a material having a corrosion resistivity capable of protecting the magnetic film in an environment where the medium is used, for example, against moisture.

In addition, if the protective film 13b possesses at least the corrosion resistivity of (3), there may be employed other material not satisfying the characteristic implementing the Kerr effect enhancement.

In the recording medium 17, information is written in a thermomagnetic writing method utilizing a laser beam with a spot diameter focused to about one micrometer and an external magnetic field; moreover, the film is a vertical magnetization film as described above, which in consequence enables the recording to be achieved with quite a high density of $10^8$ bits/cm$^2$. In addition, the recording medium develops a remarkable feature that, in principle, almost an infinite number of erase and rewrite operations can be effected thereon.

Incidentally, although the following embodiments will be described under conditions associated with an example of numeric values and other items suitable for the scope of the present invention, these conditions are only examples and hence it is to be understood that the present invention is not restricted by the conditions. Furthermore, in these embodiments, as an example of a structure of the recording medium, there has been employed the configuration of FIG. 1 so as to fabricate 19 kinds of recording media associated with the comparison example and embodiments 1-18 such that various characteristics are measured for comparison and discussion. For easy understanding of these samples, FIG. 6 shows, for each sample, constitutions of materials of the recording media, depositing conditions, and results of charactristic evaluations. In FIG. 6, *1 designates that the sample is manufactured without using a composition adjusting target and *2 denotes that a corrosion resistivity test is not conducted.

COMPARISON EXAMPLE 1

Manufacturing Conditions

For a recording medium of the comparison example, according to the known sputtering technology, there is deposited a protective film 13a of silicon monoxide (SiO) with a film thickness of about 800 angstrom (Å) on a surface of a substrate 11 of a polycarbonate resin. As for the film growing condition, there is employed a disk constituted only with silicon monoxide (SiO) having a diameter of 126 millimeters (mm) as a film growing target, and a power supplied is 500 watt (W) and a gas pressure of argon gas is three mTorr.

Subsequently, there is prepared a target for a magnetic film with a composition ratio with respect to the number of atoms of telbium, iron, and cobalt set to 22:70:8, and then under the sputtering conditions identical to those above, a magnetic film 15 is coated on a surface of the protective film 13a with a film thickness of about 800 angstrom.

Furthermore, under the same conditions as for the protective film 13a, there is formed a protective film 13b with a film thickness of about 1000 angstrom on a surface of the magnetic film 15, thereby attaining the recording medium related to the comparison example.

Measurement of C/N Ratio

For the C/N ratio of the recording medium, a measurement is achieved on the recording medium of the comparison example manufactured as a sample on a polycarbonate resin substrate such that a write operation is carried out to record data with a light having a wavelength of 830 nanometers (nm) at a rotary speed of 900 rotation per minute (r.p.m.) with a duty of 50%, a recording frequency of 1.85 MHz, and a recording power of 7 milliwatt (mW); thereafter, a read operation is accomplished with a read power of 1.6 mW and a bandwidth of 30 kHz, thereby conducting the C/N ratio measurement.

As a result, there is attained a C/N ratio of 44.0 dB for the recording medium of the comparison example.

Corrosion Resistivity Test

For the corrosion resistivity test, the recording medium of the comparison example is beforehand loaded with information and is allowed to stand for 200 hours under conditions such that the recording medium is kept retained at 60° C. and that the relative humidity is set to 80%. Thereafter, a corrosion resistivity test is carried out and then the information beforehand stored in the recording medium is reproduced to attain an error rate indicating a ratio of damages in the information, thereby evaluating the corrosion resistivity of the recording medium depending on a result of the error rate measurement and the result of the C/N ratio measurement.

As a result, the error rate is about $10^{-4}$ and the C/N ratio is 44.0 dB, which is equal to the value attained prior to the corrosion resistivity test.

Measurement of Complex Refractive Index

Under the same conditions as for the depositing of the protective film above, there is produced a sample by forming a film of silicon monoxide (SiO) with a film thickness of 2000 angstrom on a surface of a silicon wafer so as to measure an complex refractive index n-ki with a wavelength of 633 nm by means of an ellipsometer.

As a result, the complex refractive index is attained as 1.90-0.10i.

Next, description will be given of recording media associated with the embodiments 1-4 in which strontium titanate (SrTiO$_3$) is employed as the film growing target.

EMBODIMENT 1

Manufacturing Conditions

For the recording medium related to the embodiment 1, the known sputtering technology is adopted to form a protective film 13a with a film thickness of about 800 angstrom on a surface of a substrate of a polycarbonate resin under conditions such that the film forming target is constituted only with strontium titanate (SrTiO$_3$) and has a diameter of 126 mm, that the power supplied is 500 W, and that the argon gas pressure is set to 3 mTorr.

Subsequently, by use of a target for the magnetic film having the same composition as the Comparison Example 1, there is formed a magnetic film 15 with a film thickness of about 800 angstrom on a surface of the protective film 13a under the sputter conditions similar to those described in the Comparison Example 1.

Thereafter, under the same film growing conditions as for the protective film 13a above, there is deposited a protective film 13b with a film thickness of about 1000 angstrom on a surface of the magnetic film 15, thereby attained the recording medium for the embodiment 1.

Measurement of C/N Ratio

Also for the C/N ratio of the recording medium associated with the embodiment 1, a meaasurement is achieved on the recording medium manufactured as a sample on a polycarbonate resin substrate such that a write operation is carried out to record data with a light having a wavelength of 830 nanometers (nm) at a rotary speed of 900 rotation per minute (r.p.m.) with a duty of 50%, a recording frequency of 1.85 MHz, and a recoding power of 7 milliwatt (mW); thereafter, a read operation is achieved with a reading power of 1.6 mW and a bandwidth of 30 kHz, thereby conducting the C/N ratio measurement.

There is obtained, as a result, a C/N ratio of 47.5 dB for the recording medium of the embodiment 1.

Corrosion Resistivity Test

For the corrosion resistivity test, the recording medium of the embodiment 1 is beforehand loaded with information and is allowed to stand for 200 hours under conditions identical to those applied to the comparison example 1 such that the recording medium is kept retained at 60° C. and that the relative humidity is set to 80%. Thereafter, a corrosive resistivity test is carried out and then the information beforehand stored in the recording medium is restored to attain an error rate indicating a ratio of damages in the information, thereby evaluating the corrosion resistivity of the recording medium depending on a result of the error rate measurement and the result of the C/N ratio measurement.

As a result, the error rate is about $10^{-5}$ and the C/N ratio is 47.5 dB, which is identical to the value attained prior to the corrosion resistivity test.

Measurement of Complex Refractive Index

Under the same condition as for the depositing of the protective film above, there is manufactured a sample by forming a protective film on a surface of a silicon wafer so as to measure a complex refractive index n-ki with a wavelength of 633 nm by means of an ellipsometer.

As a result, the complex refractive index is attained as 2.22-0.2i.

EMBODIMENT 2

Manufacturing Conditions

For the recording medium related to the embodiment 2, the method according to the present invention is adopted to form protective films 13a and 13b and then a magnetic film 15 is formed with the same material, the same film thickness, and the depositing condition as those described above. Description will now be given in detail of the depositing conditions of the protective films. That is, there are prepared a composition adjusting target which is constituted with titanium and which has a diameter of 126 mm and a film forming target which is formed with strontium titanate (SrTiO₃) and which has a diameter of 25 mm. Thereafter, six pieces of the film forming targets are installed on a surface of the composition adjusting target. These two kinds of targets are sputtered in a state in which the surface of the composition adjusting target is covered with the film forming targets, thereby forming a protective film 13a having a film thickness of about 800 angstrom on a surface of a substrate of a polycarbonate resin. The manufacturing process is carried out under the same conditions as those described above, namely, the power supplied is 500 W and the argon gas pressure is set to 3 mTorr.

As can be seen from the description above, for the depositing of the protective films in the embodiment 2, the area ratio of the film forming target formed with strontium titanate (SrTiO₃) and the area ratio of the composition adjusting targets constituted with titanium (Ti) in the area undergone the sputtering are about 95% and 5% respectively.

Measurement of C/N Ratio

For the C/N ratio of the recording medium associated with the embodiment 2, a C/N measurement is achieved under the same conditions as those employed for the comparison example 1 and the embodiment 1. There is obtained, as a result, a C/N ratio of 46.8 dB for the recording medium of the embodiment 2.

Corrosion Resistivity Test

For the corrosion resistivity test, the recording medium of the embodiment 2 is allowed to stand for 200 hours under the corrosion resistivity conditions identical to those applied to the comparison example 1 and the embodiment 1. Thereafter, the corrosion resistivity of the recording medium is evaluated depending on a result of a measurement of a ratio of information damage or of an error rate measurement and the result of the C/N ratio measurement.

As a result, the error rate is about $10^{-5}$ and the C/N ratio is 46.8 dB, which is identical to the value attained prior to the corrosion resistivity test.

Measurement of Complex Refractive Index

Also for the measurement of an complex refractive index of the recording medium of the embodiment 2, there is manufactured a sample by forming a protective film with a film thickness of 2000 angstrom under the same condition as for the depositing of the protective film above on a surface of a silicon wafer so as to measure a complex refractive index n-ki with a wavelength of 633 nm by means of an ellipsometer like in the cases of the comparison example and the embodiment 1.

As a result, the complex refractive index is attained as 2.23-0.03i.

EMBODIMENT 3

Manufacturing Conditions

For the recording medium associated with the embodiment 3, by adopting the method in accordance with the present invention, there are deposited protective films 13a and 13b by use of titanium monoxide as the composition adjusting target, and then a magnetic film 15 is formed by using the same material, the same film thickness, and the same depositing condition as those described above.

Description will now be given in detail in the depositing conditions of the protective films. That is, there are prepared a composition adjusting target which is constituted with titanium monoxide, TiO and which has a diameter of 126 mm and a film forming target which is formed with strontium titanate (SrTiO$_3$) and which has a diameter of 25 mm. Thereafter, like in the case of the embodiment 2, with six pieces of the film forming targets placed on a surface of the composition adjusting target to undergo a sputtering, the two kinds of targets are simultaneously sputtered so as to form a protective film 13a having a film thickness of about 800 angstrom on a surface of a substrate 11 of a polycarbonate resin. The manufacturing process is carried out under the same conditions with respect to the power supplied and the argon gas pressure as those described above.

As can be seen from the description above, for the depositing of the protective films in the embodiment 3, the area ratio of the film forming target formed with strontium titanate (SrTiO$_3$) and the area ratio of the composition adjusting targets constituted with titanium monoxide (TiO) in the area undergone the sputtering are about 95% and 5% respectively.

Measurement of C/N Ratio

Also for the C/N ratio of the recording medium related to the embodiment 3, a C/N measurement is achieved under the same conditions as those employed for the comparison example 1 and the embodiments 1 and 2. There is obtained, as a result, a C/N ratio of 47.5 dB for the recording medium of the embodiment 3.

Corrosion Resistivity Test

For the corrosion resistivity test, the recording medium of the embodiment 3 is allowed to stand for 200 hours under the corrosion resistivity conditions identical to those applied to the comparison example 1 and the embodiments 1 and 2. Thereafter, there are achieved a measurement of the error rate of the recording medium of the embodiment 3 and a measurement of the C/N ratio so as to attain the values of about $10^{-5}$ and 47.5 dB, which is equal to that attained before the corrosion resistivity test.

Measurement of Complex Refractive Index

Also for the measurement of an complex refractive index of the recording medium of the embodiment 3, there is manufactured a sample by forming a protective film with a film thickness of 2000 angstrom under the same depositing conditions as described above on a surface of a silicon wafer so as to measure an complex refractive index in the same fashion as for the comparison example 1 and the embodiments 1 and 2. As a result, the complex refractive index is attained as 2.22-0.02i.

EMBODIMENT 4

Manufacturing Conditions

For the recording medium of the embodiment 4, a sample is fabricated by adopting the method in accordance with the present invention, namely, there are formed protective films 13a and 13b by use of titanium dioxide as the composition adjusting target, and then a magnetic film 15 is formed by using the same material, the same film thickness, and the same depositing conditions as those described above.

In the protective film manufacturing, there are employed the same conditions of the supplied power and the argon gas pressure as for the embodiments 2 and 3 are employed excepting that titanium dioxide (TiO$_2$) is employed as the composition adjusting target.

As can be clear from the description above, for the depositing of the protective films in the embodiment 4, the area ratio of the film forming target formed with strontium titanate (SrTiO$_3$) and the area ratio of the composition adjusting targets constituted with titanium dioxide (TiO$_2$) in the area undergone the sputtering are about 95% and 5% respectively.

Measurement of C/N Ratio

Also for the C/N ratio of the recording medium associated with the embodiment 4, a C/N measurement is conducted under the same conditions as those employed for the comparison example and the embodiments 1-3. There is obtained, as a result, a C/N ratio of 47.0 dB for the recording medium of the embodiment 4.

Corrosion Resistivity Test

For the corrosion resistivity test, the recording medium of the embodiment 4 is allowed to stand for 200 hours under the corrosion resistivity conditions identical to those applied to the comparison example 1 and the embodiments 1-3. Thereafter, there are achieved a measurement of the error rate and a measurement of the C/N ratio on the recording medium of the embodiment 3. As a result, there are obtained an error rate of about $10^{-5}$ and a C/N ratio of 47.0 dB, which is equal to that attained before the corrosion resistivity test.

Measurement of Complex Refractive Index

Also for the measurement of an complex refractive index of the recording medium of the embodiment 4, there is fabricated a sample by forming a protective film with a film thickness of 2000 angstrom under the same depositing conditions as described above on a surface of a silicon wafer so as to measure an complex refractive index in the same fashion as for the comparison example 1 and the embodiments 1-3. As a result, the complex refractive index is attained as 2.21. As can be understood from this description, the extinction coefficient is 0 for the recording medium related to the embodiment 4, namely, there is produced substantially a transparent protective film.

Subsequently, description will be given of recording media associated with the embodiments 5-8 in which barium titanate (BaTiO$_3$) is adopted as the film forming target.

EMBODIMENT 5

Manufacturing Conditions

For the recording medium of the embodiment 5, a sample is fabricated by adopting the same film relationships and the same film forming conditions as those applied to the embodiment 2 excepting that there is used a film forming target which is constituted with barium titanate (BaTiO$_3$) and which has a diameter of 126 mm, thereby attaining the recording medium of the embodiment 5.

Measurement of C/N Ratio

Also for the C/N ratio of the recording medium associated with the embodiment 5, a C/N measurement is conducted under the same conditions as those employed for the comparison example 1 and the embodiments 1-4. There is obtained, as a result, a C/N ratio of 48.0 dB for the recording medium of the embodiment 5.

Corrosion Resistivity Test

For the corrosion resistivity test, the recording medium of the embodiment 5 is allowed to stand for 200 hours under the corrosion resistivity conditions identical to those applied to the comparison example 1 and the embodiments 1-4. Thereafter, there are achieved a measurement of the error rate and a measurement of the C/N ratio on the recording medium of the embodiment 5 so as to evaluate the corrosion resistivity of the medium.

As a result, there are obtained an error rate of about $10^{-5}$ and a C/N ratio of 48.0 dB, which is equal to that attained before the corrosion resistivity test.

Measurement of Complex Refractive Index

Also for the measurement of an complex refractive index of the recording medium of the embodiment 5, there is fabricated a sample by forming a protective film with a film thickness of 2000 angstrom under the same depositing conditions as described above on a surface of a silicon wafer so as to measure an complex refractive index n-ki by means of an ellipsometer. There is attained, as a result, an complex refractive index of 2.25-0.02i.

EMBODIMENT 6

Manufacturing Conditions

For the recording medium of the embodiment 6, a sample is manufactured by utilizing the same film relationships and the same film forming conditions as those applied to the embodiment 2 excepting that there is used a film forming target which is constituted with barium titanate (BaTiO$_3$) and which has a diameter of 25 mm.

That is, with six pieces of film forming targets installed on a surface of the composition adjusting target which is constituted with titanium, Ti and which has a diameter of 126 mm, these two kinds of targets are simultaneously sputtered so as to fablicate protection films 13a and 13b. The film forming conditions with respect to the applied power and the argon gas pressure are the same as those described above.

As can be seen from the description above, for the depositing of the protective films in the embodiment 6, the area ratio of the film forming target formed with barium titanate (BaTiO$_3$) and the area ratio of the composition adjusting targets constituted with titanium (Ti) in the area undergone the sputtering are about 95% and 5% respectively.

Measurement of C/N Ratio

Also for the C/N ratio of the recording medium associated with the embodiment 6, there is conducted a C/N measurement under the same conditions as those employed for the comparison example 1 and the embodiments 1-5. As a result, a C/N ratio of 47.0 dB is attained for the recording medium of the embodiment 6.

Corrosion Resistivity Test

For the corrosion resistivity test, the recording medium of the embodiment 6 is allowed to stand for 200 hours under the corrosion resistivity conditions identical to those applied to the comparison example 1 and the embodiments 1-5. Thereafter, there are effected a measurement of the error rate and a measurement of the C/N ratio on the recording medium of the embodiment 6 so as to evaluate the corrosion resistivity of the medium.

As a result, there are obtained an error rate of about $10^{-5}$ and a C/N ratio of 47.0 dB, which is equal to the value attained before the corrosion resistivity test.

Measurement of Complex Refractive Index

Also for the measurement of an complex refractive index of the recording medium of the embodiment 6, there is fabricated a sample by forming a protective film with a film thickness of 2000 angstrom under the same depositing conditions as described above on a surface of a silicon wafer so as to measure an complex refractive index in the similar fashion as for as the comparison example 1 and the embodiments 1-5. There is attained, as a result, an complex refractive index of 2.27-0.02i.

EMBODIMENT 7

Manufacturing Conditions

For the recording medium of the embodiment 7, there is employed the method according to the present invention so as to produce a sample by utilizing the same film relationships and the same film forming conditions as those applied to the embodiment 3 excepting that there is used a film forming target which is constituted with barium titanate (BaTiO$_3$) and which has a diameter of 25 mm. That is, with six pieces of film forming targets amounted on a surface of the composition adjusting target which is constituted with titanium monoxide (TiO) and which has a diameter of 126 mm, these two kinds of targets are simultaneously sputtered so as to fablicate protection films 13a and 13b. The film forming conditions with respect to the applied power and the argon gas pressure are the same as those described above.

As can be understood from the description above, for the depositing of the protective films in the embodiment 7, the area ratio of the film forming target formed with barium titanate (BaTiO$_3$) and the area ratio of the composition adjusting targets constituted with titanium monoxide (TiO) in the area undergone the sputtering are about 95% and 5% respectively.

Measurement of C/N Ratio

Also for the C/N ratio of the recording medium associated with the embodiment 7, there is achieved a C/N measurement under the same conditions as those utilized for the comparison example 1 and the embodiments 1-6. As a result, a C/N ratio of 48.0 dB is attained for the recording medium of the embodiment 7.

Corrosion Resistivity Test

For the corrosion resistivity test, the recording medium of the embodiment 7 is allowed to stand for 200 hours under the same corrosion resistivity conditions as those applied to the comparison example 1 and the embodiments 1-6. Thereafter, there are accomplished a measurement of the error rate and a measurement of the C/N ratio on the recording medium of the embodiment 7 so as to evaluate the corrosion resistivity of the medium.

As a result, there are obtained an error rate of about $10^{-5}$ and a C/N ratio of 48.0 dB, which is equal to that attained before the corrosion resistivity test.

Measurement of Complex Refractive Index

For the measurement of an complex refractive index of the recording medium of the embodiment 7, there is also fabricated a sample by forming a protective film with a film thickness of 2000 angstrom under the same depositing conditions as described above on a surface of a silicon wafer so as to measure an complex refractive index n-ki with a wavelength of 633 nm by use of an ellipsometer. There is attained, as a result, an complex refractive index of 2.25-0.02i.

EMBODIMENT 8

Manufacturing Conditions

For the recording medium of the embodiment 8, there is produced a sample by using the same conditions as those applied to the embodiment 4 excepting that there is used a film forming target which is constituted with barium titanate ($BaTiO_3$) and which has a diameter of 25 mm. That is, with six pieces of film forming targets mounted on a surface of the composition adjusting target which is constituted with titanium dioxide ($TiO_2$) and which has a diameter of 126 mm, these two kinds of targets are simultaneously sputtered so as to manufacture protection films 13a and 13b. The film forming conditions with respect to the applied power and the argon gas pressure are the same as those described above.

As can be seen from the description above, for the depositing of the protective films in the embodiment 8, the area ratio of the film forming target formed with barium titanate ($BaTiO_3$) and the area ratio of the composition adjusting targets constituted with titanium dioxide ($TiO_2$) in the area undergone the sputtering are about 95% and 5% respectively.

Measurement of C/N Ratio

For the C/N ratio of the recording medium associated with the embodiment 8, there is achieved a C/N measurement under the same conditions as those utilized for the comparison example 1 and the embodiments 1–7. As a result, a C/N ratio of 47.5 dB is attained for the recording medium of the embodiment 8.

Corrosion Resistivity Test

For the corrosion resistivity test, the recording medium of the embodiment 8 is allowed to stand for 200 hours under the same corrosion resistivity conditions as those applied to the comparison example 1 and the embodiments 1–7. Thereafter, there are accomplished a measurement of the error rate and a measurement of the C/N ratio on the recording medium of the embodiment 8. As a result, there are obtained an error rate of about $10^{-5}$ and a C/N ratio of 47.5 dB, which is equal to the value attained before the corrosion resistivity test.

Measurement of Complex Refractive Index

For the measurement of an complex refractive index of the recording medium of the embodiment 8, there is also produced a sample by forming a protective film with a film thickness of 2000 angstrom under the same depositing conditions as described above on a surface of a silicon wafer so as to measure the complex refractive index in the similar fashion to those applied to the comparison example 1 and the embodiments 1–7, thereby attaining a value of 2.21 for the complex refractive index. As can be understood from the description above, like in the case of the recording medium of the embodiment 4, the extinction coefficient k is 0, namely, there is implemented substantially a transparent protective film.

Subsequently, description will be given of the embodiments 9–12 in which strontium titanate ($SrTiO_3$) and barium titanate ($BaTiO_3$) are employed for the film forming target in the protective film manufacturing process.

EMBODIMENT 9

Manufacturing Conditions

For the recording medium associated with the embodiment 9, according to the known sputtering technology, there are produced a recording medium sample by adopting the film relationships and the film forming conditions similar to those applied to the embodiments 1 and 5 excepting that protective films 13a and 13b are formed by use of a film forming target which includes a mixed crystal constituted with strontium titanate ($SrTiO_3$) and barium titanate ($BaTiO_3$) with a composition of ratio of 1:1 and which has a diameter of 126 mm. The film manufacturing process is carried out under the same conditions with respect to the power supplied and the argon gas pressure as those described above.

Measurement of C/N Ratio

For the C/N ratio of the recording medium related to the embodiment 9, a C/N measurement is achieved under the same conditions as those applied to the comparison example 1 and the embodiments 1–8. There is obtained, as a result, a C/N ratio of 48.0 dB for the recording medium.

Incidentally, the corrosion resistivity test has not been conducted for the magneto-optical recording medium associated with the embodiment 9.

Measurement of Complex Refractive Index

For the measurement of an complex refractive index of the recording medium of the embodiment 9, there is also manufactured a sample by forming a protective film with a film thickness of 2000 angstrom under the same depositing conditions as describd above on a surface of a silicon wafer so as to measure a complex refractive index in the same fashion as for the comparison example 1 and the embodiments 1 $\propto$ 8. As a result, the complex refractive index is attained as 2.24–0.02i.

EMBODIMENT 10

For the recording medium associated with the embodiment 10, there are produced a sample by adopting the film relationships and the film forming conditions similar to those applied to the embodiments 3 and 7 excepting that protective films 13a and 13b are formed by use of film forming targets which are respectively constituted with strontium titanate ($SrTiO_3$) and barium titanate ($BaTiO_3$) and which have a diameter of 25 mm. That is, on a surface of the composition adjusting target which is constituted with titanium (Ti) and which has a diameter of 126 mm, there are placed three film forming targets formed with strontium titanate ($SrTiO_3$) and three film forming targets constituted with barium titanate ($BaTiO_3$ such that these three kinds of targets are simultaneously sputtered to form protective films 13a and 13b. The film manufacturing process is carried out under the same conditions with respect to the power supplied and the argon gas pressure as those described above.

As can be seen from the description above, for the depositing of the protective films in the embodiment 10, the area ratio of the film forming target formed with strontium titanate ($SrTiO_3$) and barium titanate ($BaTiO_3$) and the area ratio of the composition adjusting targets constituted with titanium (Ti) in the area undergone the sputtering are about 95% and 5% respectively.

Measurement of C/N Ratio

For the C/N ratio of the recording medium associated with the embodiment 10, a C/N measurement is conducted under the same conditions as those employed for the comparison example 1 and the embodiments 1–9. There is obtained, as a result, a C/N ratio of 47.0 dB for the recording medium.

Incidentally, like in the case of the embodiment 9 above, the corrosion resistivity test has not been conducted for the magneto-optical recording medium associated with the embodiment 10.

Measurement of Complex Refractive Index

Also for the measurement of a complex refractive index of the recording medium of the embodiment 11, there is produced a sample by forming a protective film with a film thickness of 2000 angstrom under the same depositing conditions as described above on a surface of a silicon wafer so as to measure an complex refractive index in the same fashion as for the comparison example 1 and the embodiments 1–9. As a result, the complex refractive index is attained as 2.26–0.03i.

EMBODIMENT 11

Manufacturing Conditions

For the recording medium of the embodiment 11, according to the method described above, there is manufactured a sample by adopting the same film relationships and the same film forming conditions as those applied to the embodiment 10 excepting that there is used a composition adjusting target which is constituted with titanium monoxide (TiO). That is, on a surface of the composition adjusting target which is constituted with titanium monoxide (TiO) and which has a diameter of 126 mm, there are placed three film forming targets formed with strontium titanate ($SrTiO_3$) and three film forming targets constituted with barium titanate ($BaTiO_3$) such that these three kinds of targets are simultaneously sputtered to form protective films 13a and 13b. The film manufacturing process is carried out under the same conditions with respect to the applied power and the argon gas pressure as those described above.

As can be seen from the description above, for the depositing of the protective films in the embodiment 11, the area ratio of the film forming target formed with strontium titanate ($SrTiO_3$) and barium titanate ($BaTiO_3$) and the area ratio of the composition adjusting targets constituted with titanium monoxide (TiO) in the area undergone the sputtering are about 95% and 5% respectively.

Measurement of C/N Ratio

For the C/N ratio of the recording medium associated with the embodiment 11, there is achieved a C/N measurement under the same conditions as those employed for the comparison example 1 and the embodiments 1–10. There is obtained, as a result, a C/N ratio of 48.0 db for the recording medium.

Corrosion Resistivity Test

For the corrosion resistivity test, the recording medium of the embodiment 11 is allowed to stand for 1000 hours under the corrosion resistivity test conditions above. Thereafter, there are achieved a measurement of the error rate and a measurement of the C/N ratio on the recording medium of the embodiment 11. As a result, there are obtained an error rate of about $10^{-5}$ and a C/N ratio of 48.0 dB, which is equal to that attained before the corrosion resistivity test.

Measurement of Complex Refractive Index

Also for the measurement of a complex refractive index of the recording medium of the embodiment 11, there is fabricated a sample by forming a protective film with a film thickness of 2000 angstrom under the same depositing conditions as described above on a surface of a silicon wafer so as to measure the complex refractive index. There is attained, as a result, a complex refractive index of 2.24–0.2i.

EMBODIMENT 12

Manufacturing Conditions

For the recording medium of the embodiment 12, according to the method described above, there is manufactured a sample utilizing the same film relationships and the same film forming conditions as those applied to the embodiment 11 excepting that there is used a composition adjusting target which is constituted with titanium dioxide ($TiO_2$). That is, three film forming targets constituted with strontium titanate ($SrTiO_3$) and three film forming targets formed with a barium titanate ($BaTiO_3$) are placed on a surface of the composition adjusting target which is constituted with titanium dioxide ($TiO_2$) and which has a diameter of 126 mm such that these two kinds of targets are simultaneously sputtered so as to produce protection films 13a and 13b. The film forming conditions with respect to the applied power and the argon gas pressure are the same as those described above.

As can be seen from the description above, for the depositing of the protective films in the embodiment 12, the area ratio of the film forming target formed with strontium titanate ($SrTiO_3$) and barium titanate ($BaTiO_3$) and the area ratio of the composition adjusting targets constituted with titanium dioxide ($TiO_2$) in the area undergone the sputtering area about 95% and 5% respectively.

Measurement of C/N Ratio

For the C/N ratio of the recording medium of the embodiment 12, there is conducted a C/N measurement under the same conditions as those employed for the comparison example 1 and the embodiments 1–11. As a result, there is obtained a C/N ratio of 48.2 dB for the recording medium.

Corrosion Resistivity Test

For the corrosion resistivity test, the recording medium of the embodiment 12 is allowed to stand for 1000 hours under the corrosion resistivity test conditions identical to those applied to the the embodiments 11 so as to thereafter effect a measurement of the error rate and a measurement of the C/N ratio on the recording medium of the embodiment 12. As a result, there are obtained an error rate of about $10^{-5}$ and a C/N ratio of 48.2 dB, which is equal to the value attained before the corrosion resistivity test.

Measurement of Complex Refractive Index

For the measurement of an complex refractive index of the recording medium of the embodiment 12, there is also produced a sample by forming a protective film with a film thickness of 2000 angstrom under the same depositing conditions as described above on a surface of a silicon wafer, thereby measuring an complex refractive index in the similar fashion as for the comparison example 1 and the embodiments 1-11. There is attained, as a result, an complex refractive index of 2.22. As can be understood from the description above, like in the case of the recording media associated with the embodiments 4 and 8, the extinction coefficient k is 0, namely, there is obtained substantially a transparent protective film.

Referring next to the table of FIG. 6, description will be given in detail of characteristics of the comparison example 1 and those of the embodiments 1-12.

First, the C/N ratio will be described. As can be understood from FIG. 6 and the description above, when compared with the C/N value of 44.0 dB for the comparison example 1, the C/N values are improved in the recording media associated with the embodiments 1-12, namely, the characteristic is improved in this regard. As an example, among these embodiments, the embodiment 2 has the lowest value of 46.8 dB as the C/N ratio, which indicates an increase of 2.8 dB as compared with the comparison example 1. In addition, the C/N ratio is greatly increased in the recording medium of the embodiment 12, namely, there is attained a value of 48.2 dB, which is greater than the C/N ratio of the comparison example 1 by 4.2 dB.

Furthermore, as can be seen from the results of the corrosion resistivity tests, for each of the recording media asociated with the comparison example 1 and the embodiments 1-8, 11, and 12, there has not been recognized any decrease in the C/N ratio measured after the 200-hour corrosion resistivity test. In particular, for the recording media of the embodiments 11 and 12, the C/N ratio does not show any decrease even after the 1000-hour corrosion resistivity test.

On the other hand, as already described above, it is found from the results of the error rate measurements that the error rate is about 10-4 for the recording medium related to the comparison example 1 after the medium is kept retained in the corrosion resistivity test conditions for 200 hours. In contrast thereto, for the recording media asociated with the comparison example and the embodiments 1-8, 11, and 12, a value of about $10^{-5}$ has been obtained under the same conditions as those applied to the comparison example 1, namely, it is recognized that the stability of the recording media is increased due to the constitutions of the materials of the protective films produced according to the present invention. Moreover, for the recording media of the embodiments 11 and 12, even after the media are kept retained under the corrosion resistivity test conditions for 1000 hours, there is developed an error rate of about $10^{-5}$. Namely, it is understood that with provisions of the protective film manufactured by simultaneously sputtering strontium titanate (SrTiO3) and barium titanate (BaTiO3), there is obtained a considerable improvement in the stability of the recorded information stored in the pertinent media.

In addition, as for the refractive index n of the complex refractive index n-ki, the sample of the comparison example 1 develops a value of 1.90; whereas the values of the refractive index n obtained for the samples related to the embodiments 1-12 are at least 2.21, which means that the C/N ratio is improved owing to the Kerr effect enhancement.

Furthermore, as for the extinction coefficient k, a value of 0.10 is attained for the comparison example 1; whereas there is recognized a great improvement in any embodiment above, and in particular, for the samples realated to the embodiments 4, 8, and 12, the extinction coefficient k is 0, which means that the depositing of the protective film is conducted by use of substantially a transparent material.

In addition, as can be understood from the table of FIG. 6, through comparisons effected among three kinds of recording media related to the embodiments 2-4, it is found that there exists a tendency that as the ratio of oxygen contained in the composition adjusting target is increased, the value of the extinction coefficient k becomes to be smaller. Such a tendency is also recognized by comparing the results associated with the embodiments 6-8 or 10-12.

Moreover, effecting comparison of the refractive index n among the recording media related to the embodiments 1 and 2, 5 and 6, or 9 and 10, respectively, it is recognizable that the refractive index n is improved by utilizing titanium (Ti) for the composition adjusting target.

As can be understood from the comparisons effected among the comparison example and the embodiments 1-12, for the recording media which are manufactured with various material compositions in a method according to the present invention and for which the composition adjusting target and the film forming target are simultaneously sputtered, there can be produced recording media having characteristics superior to those developed by the conventional recording media.

Next, dascription will be given of an embodiment of a method according to the present invention with reference to the recording media related to the embodiments 13-15 in which the protective films are produced by sputtering only a composition adjusting target in a mixed atmosphere of an inert gas and oxygen. Incidentally, like in the case of th embodiments 9 and 10, the corrosion resistivity test is not conducted on the recording media above.

EMBODIMENT 13

Manufacturing Conditions

For the recording medium associated with the embodiment 13, excepting that there are formed protective films 13a and 13b by effecting a sputtering operation in a mixed atmosphere constituted with argon and oxygen with a constitution ratio of 80:20 (volume %), there is produced a sample by using the same film relationships and the same film forming conditions as those of the embodiment 1 employing a composition adjusting target which is constituted with strontium titanate (SrTiO3) and which has a diameter of 126 mm. The film manufacturing process is carried out with the same power as described above, and the gas pressure of the mixed atmosphere in 3 mTorr.

Measurement of C/N Ratio

For the C/N ratio of the recording medium related to the embodiment 13, a C/N measurement is achieved under the same conditions as those employed for the comparison example 1 and the embodiments 1 and 12. There is obtained, as a result, a C/N ratio of 47.6 dB for the recording medium.

Measurement of Complex Refractive Index

Also for the measurement of a complex refractive index of the recording medium of the embodiment 13, there is manufactured a sample by forming a protective film with a film thickness of 2000 angstrom under the same depositing conditions as described above on a surface of a silicon wafer so as to measure an complex refractive index in the same fashion as for the comparison example 1 and the embodiments 1 and 12. As a result, the complex refractive index is attained as 2.22. As can be understood from the description above, like in the case of the recording media of the embodiments 4, 8, and 12, the extinction coefficient k is 0, which namely indicates that the protective film is substantially transparent with respect to light.

EMBODIMENT 14

Manufacturing Conditions

For the recording medium of the embodiment 14, excepting that there are formed protective films 13a and 13b by effecting a sputtering operation in a mixed atmosphere constituted with argon and oxygen with a composition ratio of b 80:20 (volume %), a sample is prepared by use of the same film relationships and the same film forming condidtions as those employed for the embodiment 5 employing a film forming target which is constituted with barium titanate (BaTiO$_3$) and which has a diameter of 126 mm. In the protective film manufacturing, there are employed the same condition for the supplied power as described above and the gas pressure of the mixed gas is set to 3 mTorr.

Measurement of C/N Ratio

For the C/N ratio of the recording medium associated with the embodiment 14, there is achieved a C/N measurement under the same conditions as those used for the comparison example 1 and the embodiments 1-13. As a result, there is obtained a C/N ratio of 47.5 dB for the recording medium.

Measurement of Complex Refractive Index

Also for the measurement of a complex refractive index of the recording medium of the embodiment 14, there is fabricated a sample by forming a protective film having film thickness of 2000 angstrom under the same depositing conditions as described above on a surface of a silicon wafer so as to measure a complex refractive index in the same fashion as for the comparison example 1 and the embodiments 1-13. As a result, the complex refractive index is attained as 2.21. As can be seen from this description, like in the cases of the embodiments 4, 8, 12, and 13 above, the extinction coefficient k is 0 for the recording medium related to the embodiment 14, namely, there is produced substantially a transparent protective film.

EMBODIMENT 15

Manufacturing Conditions

For the recording medium of the embodiment 15, excepting that there are formed protective films 13a and 13b in a mixed atmosphere constituted with argon and oxygen with ratio of 80:20 (volume %), a sample is fabricated by adopting the same film relationships and the same film forming conditions as those applied to the embodiment 9 utilizing a film forming target which is constituted with a mixed crystal of strontium titanate (SrTiO$_3$) and barium titanate (BaTiO$_3$) with a compsition ratio set to 1:1 and which has a diameter of 126 mm. In the protective film manufacturing, there are adopted the same power as that described above and the mixed gas pressure is set to 3 mTorr.

Measurement of C/N Ratio

For the C/N ratio of the recording medium associated with the embodiment 15, a C/N measurement is conducted under the same conditions as those employed for the comparison example 1 and the embodiments 1-14, thereby obtaining, as a result, a C/N ratio of 48.1 dB for the recording medium.

Measurement of Complex Refractive Index

For the measurement of a complex refractive index of the recording medium of the embodiments 15, there is also produced a sample by forming a protective film with a film thickness of 2000 angstrom under the same coating conditions as described above on a surface of a silicon wafer so as to measure a complex refractive index in the same fashion as for the comparison example 1 and the embodiments 1-14. There is attained, as a result, a complex refractive index of 2.23. As can be understood from the description, like in the cases of the embodiments 4, 8, and 12-14 above, the extinction coefficient k is 0 for the recording medium related to the embodiment 15, namely, the deposited protective film is substantially transparent with respect to light.

As can be recognized from the characteristics developed by the recording media related to the embodiments 13-15, according to the method associated with the present invention, there are produced protective films by effecting a sputtering operation in a mixed atmosphere of an inert gas and oxygen so as to obtain a complex refractive index, which is substantially identical to the indices developed in the cases where titanium dioxide (TiO$_2$) is adopted for the composition adjusting target, thereby manufacturing substantially transparent protective films.

Next, dascription will be given of an embodiment of a method according to the present invention by referencing the recording media associated with the embodiments 16-18 in which the protective films are deposited by simultaneously effecting a sputtering operation onto film forming targets and a composition adjusting target in a mixed atmosphere constituted with an inert gas and oxygen. Incidentally, as can be seen from the embodiments according to the present invention, there has been developed an increase in the refractive index when the protective films are formed by use of titanium (Ti) for the composition adjusting target. In consequence, titanium (Ti) is employed as the composition adjusting target; furthermore, in order to facilitate comparisons with respect to the embodiments above, the characteristics are measured in a mixed atmosphere of argon and oxygen with a composition ratio set to 80:20 (volume %).

EMBODIMENT 16

Manufacturing Conditions

For the recording medium of the embodiment 16, a sample is manufactured by utilizing the film relationships and the film forming conditions identical to those applied to the embodiment 2 excepting that there are formed protective films 13a and 13b by conducting a sputtering operation in a mixed atmosphere of argon and oxygen with a composition ratio of 80:20 (volume %). That is, there are prepared a composition adjusting target of titanium (Ti) having a diameter of 126 mm and film forming targets of strontium titanate (SrTiO3) with a diameter of 25 mm such that six pieces of film forming targets are installed on a surface of the composition adjusting target so as to effect the sputtering onto these two kinds of targets at the same time. As for the film depositing conditions, there is employed the same power as described above, and the gas pressure of the mixed atmosphere is set to 3 mTorr.

Measurement of C/N Ratio

For the C/N ratio of the recording medium associated with the embodiment 16, there is conducted a C/N measurement under the conditions identical to those used for the comparison example 1 and the embodiments 1-15. As a result, a C/N ratio of 47.5 dB is attained for the recording medium.

Corrosion Resistivity Test

For the corrosion resistivity test, the recording medium of the embodiment 16 is allowed to stand for 200 hours under the corrosion resistivity test conditions employed for the comparison example 1 and the embodiments 1-8. Thereafter, there are effected a measurement of the error rate and a measurement of the C/N ratio on the recording medium.

As a result, there are obtained an error rate of about $10^{-5}$ and a C/N ratio of 47.5 dB, which is equal to the value attained before the corrosion resistivity test.

Measurement of Complex Refractive Index

Also for the measurement of a complex refractive index of the recording medium of the embodiment 16, there is prepared a sample by forming a protective film having a film thickness of 2000 angstrom under the same depositing conditions as described above on a surface of a silicon wafer so as to measure a complex refractive index in the similar fashion as for the comparison example 1 and the embodiments 1-15. There is attained, as a result, a complex refractive index of 2.23. As can be recognized from the description, like in the cases of the embodiments 4, 8, and 12-15 above, the extinction coefficient k is 0 for the recording medium related to the embodiment 15, namely, there is produced substantially a transparent protective film.

EMBODIMENT 17

Manufacturing Conditions

For the recording medium of the embodiment 17, there is produced a sample by adopting the same film relationships and the same film forming conditions as those applied to the embodiment 6 excepting that there are created protective film 13a and 13b by conducting a sputtering operation in a mixed atmosphere of argon and oxygen with a composition ratio set to 80:20 (volume %). That is, there are prepared a composition adjusting target of titanium (Ti) having a diameter of 126 mm and film forming targets of barium titanate (BaTiO3) with a diameter of 25 mm such that six pieces of film forming targets are located on a surface of the composition adjusting target so as to effect the sputtering onto these two kinds of targets at the same time. As for the film forming conditions, there is employed the same power as described above, and the gas pressure of the mixed atmosphere is set to 3 mTorr.

Measurement of C/N Ratio

For the C/N ratio of the recording medium associated with the embodiment 17, a C/N measurement is conducted under the same conditions as those utilized for the comparison example 1 and the embodiments 1-16. As a result, there is obtained a C/N ratio of 47.0 dB for the recording medium.

Corrosion Resistivity Test

For the corrosion resistivity test, the recrding medium of the embodiment 17 is allowed to stand for 200 hours under the same corrosion resistivity test conditions as those applied to the comparison example 1 and the embodiments 1-8. Thereafter, there are accomplished a measurement of the error rate and a measurement of the C/N ratio on the recording medium.

There are obtained, as a result, an error rate of about $10^{-5}$ and a C/N ratio of 47.0 dB, which is equal to that attained before the corrosion resistivity test.

Measurement of Complex Refractive Index

For the measurement of an complex refractive index of the recording medium of the embodiment 17, there is also fabricated a sample by forming a protective film with a film thickness of 2000 angstrom under the same depositing conditions as described above on a surface of a silicon wafer so as to measure a complex refractive index in the similar fashion as for the comparison example 1 and the embodiments 1-16, thereby attaining, as a result, a complex refractive index of 2.25. As can be seen from the description, like in the cases of the embodiments 4, 8, and 12-16 above, the extinction coefficient k is 0 for the recording medium related to the embodiment 17, namely, there is created substantially a transparent protective film.

EMBODIMENT 18

Manufacturing Conditions

For the recording medium of the embodiment 18, there is produced a sample by using the same conditions as those applied to the embodiment 10 excepting that there are deposited protective films 13a and 13b by achieving a sputtering operation in a mixed atmosphere of argon and oxygen with a composition ratio set to 80:20 (volume %). That is, on a surface of a composition adjusting target of titanium (Ti) having a diameter of 126 mm, there are placed three pieces of film forming targets of strontium titanate (SrTiO3) with a diameter of 25 mm and three pieces of film forming targets of barium titanate (BaTiO3) with a diameter of 25 mm so as to effect the sputtering onto these three kinds of targets at the same time in the mixed atmosphere. As for the film forming conditions, there is employed the same power as described above, and the gas pressure of the mixed atmosphere is set to 3 mTorr.

Measurement of C/N Ratio

For the C/N ratio of the recording medium of the embodiment 18, there is achieved a C/N measurement under the same conditions as those utilized for the comparison example 1 and the embodiments 1-7. There is attained, as a result, a C/N ratio of 47.9 dB for the recording medium of the embodiment 8.

Incidentally, the corrosion resistivity test is not carried out on the recording medium of the embodiment 18.

Measurement of Complex Refractive Index

Also for the measurement of an complex refractive index of the recording medium of the embodiment 18, there is manufactured a sample by forming a protective film having a film thickness of 2000 angstrom under the same depositing conditions as described above on a surface of a silicon wafer so as to measure the complex refractive index in the similar fashion to those applied to the comparison example 1 and the embodiments 1-17, thereby attaining a value of 2.24 for the complex reractive index. As can be understood from the description above, like in the case of the recording medium of the embodiments 4, 8, and 12-17, the extinction coefficient k is 0, namely, there is implemented a protective film which is substantially transparent with respect to light.

Referring to the drawings, dascription will be next given of an embodiment according to the present invention with reference to results of measurements of a complex refractive index conducted on samples manufactured by achiving a sputtering operation on the film forming target and the composition adjusting target in a mixed atmosphere of an inert gas and oxygen in which the composition ratio of oxygen is changed.

Manufacturing Conditions of Sample

In the measurements, like in the cases of the comparison example 1 and the embodiments 1-18, there is employed a sample produced by forming a protective film with a film thickness of 2000 angstrom.

Description will now be given in detail of the sample manufacturing conditions. First, there are prepared a film forming target of strontium titanate ($SrTiO_3$) and a composition adjusting film of barium titanate ($BaTiO_3$) respectively havig the same dimensions as those used for the embodiment 2. Thereafter, in a depositing atmosphere of a sputtering gas including argon and oxygen in which the composition ratio of oxygen is varied in a range from 0 to 50 volume %, the film manufacturing is conducted by effecting the sputtering operation at the same time onto the composition adjusting target and the two kinds of composition adjusting targets. Incidentally, the depositing conditions are kept unchanged for all samples, namely, the applied power is 500 W and the sputtering gas including the mixed gas is set to 3 mTorr.

Figure 2:
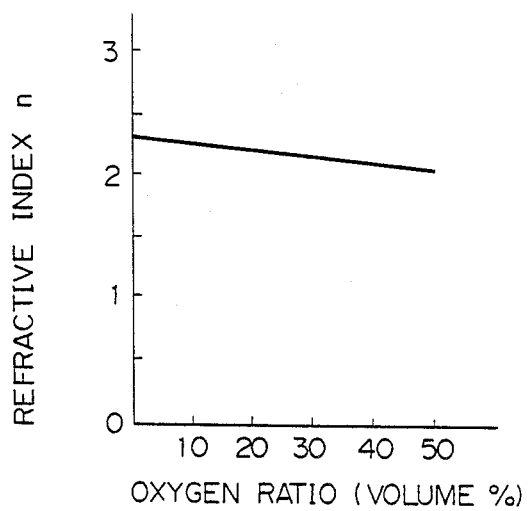
FIGS. 2 and 4 are graphs showing characteristic curves for understanding the embodiment according to the present invention in which the ordinate and the abscissa respectively represent the refractive index n and the ratio of oxygen in the sputtering atmosphere.
Figure 3:
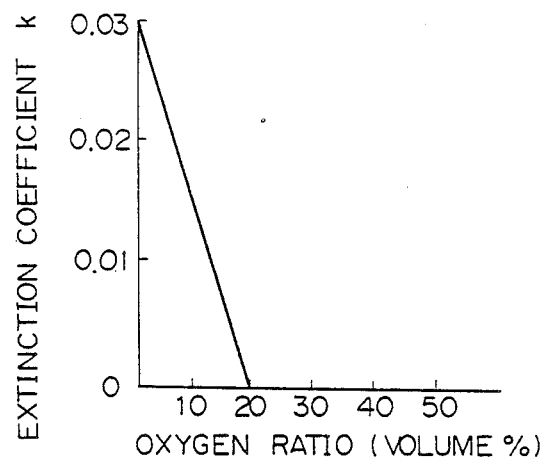
FIGS. 3 and 5 are graphs showing characteristic curves for understanding the embodiment according to the present invention in which the ordinate and the abscissa respectively represent the extinction coefficient k and the ratio of oxygen in the sputtering atmosphere.

FIGS. 2 and 3 show characteristic curves representing the measured results of complex refractive index n-ki of the samples thus produced under the manufacturing conditions above. In FIG. 2, the ordinate and abscissa respectively indicate a refractive index n and a composition ratio (volume %) of oxygen; whereas in FIG. 3, the ordinate and abscissa respectively designate a extinction coefficient k and a composition ratio (volume %) of oxygen.

First, as can be seen from FIG. 2, there is recognized a tendency that as the content of oxygen in the sputtering gas is increased, the refractive index is decreased. For example, in a case where the sputtering gas does not include oxygen (0 volume %; corresponding to the embodiment 2 with the composition ratio of argon set to 100 volume %), the refractive index n is attained as 2.23; whereas when the composition ratio of oxygen is increased to 50 volume %, the refractive index n is lowered to about 2.1.

Furthermore, as can be understood form FIG. 3, there is also found a similar tendency with respect to the extinction coefficient k, namely, for a sample which has the oxygen content of 0 volume% in the sputtering gas and which is associated with the embodiment 2, the extinction coefficient k is attained as 0.03. In contrast thereto, in a case where the composition ratio of oxygen is set to 20 volume % in the mixed atmosphere for the sputtering operation, the extinction coefficient k takes a value of 0 depending on conditions, which also applies to a case where the oxygen content is set to a value exceeding 20 volume %.

Description will be next given of results of measurements of a complex refractive index conducted on samples manufactured by effecting a sputtering operation by use of barium titanate ($BaTiO_3$) in place of strontium titanate ($SrTiO_3$) for the film forming target in a mixed atmosphere of argon and and oxygen in which the composition ratio of oxygen is changed. Incidentally, the sample manufacturing conditions are the same as those above excepting that barium titanate ($BaTiO_3$) is employed in place of strontium titanate ($SrTiO_3$) so as to produce samples by depositing a surface of a silicon wafer with a protective film having a film thickness of 2000 angstrom.

Figure 4:
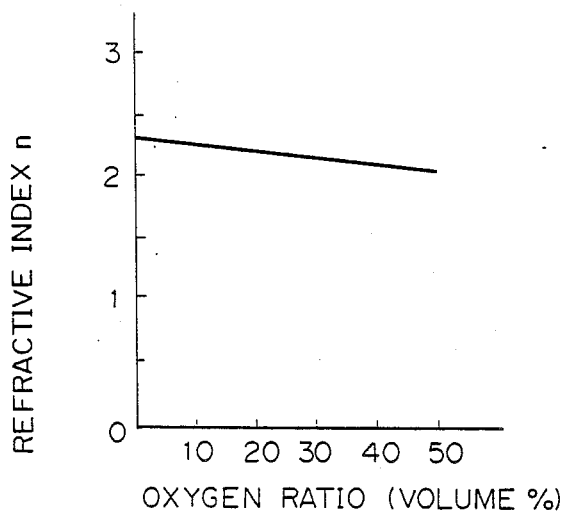
Figure 5:
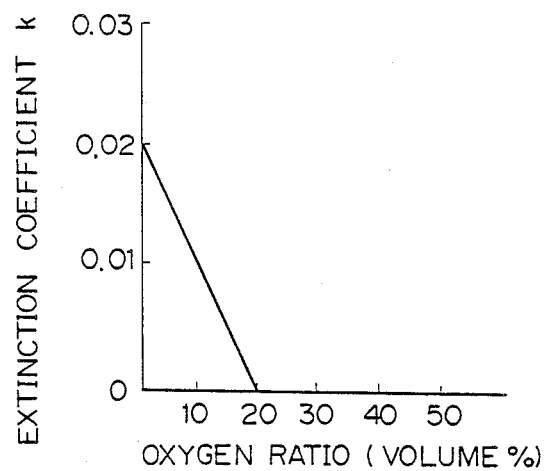

FIGS. 4 and 5 show, like in the case of FIGS. 2 and 3, characteristic curves representing the measured results of complex refractive index n-ki of the samples. In FIG. 4, the ordinate and abscissa respectively indicate a refractive index n and a composition ratio (volume %) of oxygen; whereas in FIG. 3, the ordinate and abscissa respectively designate a extinction coefficient k and a composition ratio (volume %) of oxygen.

First, as can be seen from FIG. 4, like in the case associated with strontium titanate ($SrTiO_3$), also for the samples in which the depositing is carried out in the mixed atmosphere containing barium titanate ($BaTiO_3$), there is found a tendency that with an increase in the content of oxygen in the sputtering gas, the refractive index is decreased. For example, in a case where the sputtering does not include oxygen (0 volume %; corresponding to the embodiment 6 with the composition ratio of argon set to 100 volume %), the refractive index n is 2.27. In contrast thereto, when the composition ratio of oxygen is increased to 50 volume %, the refractive index n is lowered to about 2.1.

In addition, as can be seen form FIG. 5, there is also developed a similar tendency with respect to the extinction coefficient k, like in the case related to strontium titanate ($SrTiO_3$), namely, for a sample produced with the oxygen content set to 0 volume % in the sputtering gas (associated with the embodiment 6), the extinction coefficient k is obtained as 0.02. In contrast thereto, in a case where the composition ratio of oxygen is set to 20 volume % in the mixed atmosphere for the sputtering operation, like in the case related to strontium titanate ($SrTiO_3$), the extinction coefficient k takes a value of 0 depending on conditions. This implies that the extinction coefficient k takes a value of 0 even when the oxygen content is set to a value exceeding 20 volume %.

EMBODIMENT 19

Description will be now given of embodiments in a case where a magneto-optical recording medium inlcudes a protective film constituted with a nitride of barium titanate ($BaTiO_xN_y$). In these embodiments, a recording medium is porduced with a protective film formed under a predetertmined film forming condition so as to conduct measurements of recording characteristics thereof and to achieve a corrosion resistivity tests thereon, thereby detecting changes in the recordig characteristics. In addition, description will be also given of results of refrative index measurements conducted on the nitride of barium titanate (BaTiOxNy) according to an ordinary method.

Manufacturing Conditions

First, in this embodiment, according to a known sputtering technology, on a surface of a substrate 11 constituted with a polycarbonate resin, there is formed a protective film 13a with a film thickness of about 800 angstrom under the film forming conditions that there is employed a target of barium titanate ($BaTiO_3$) with a diameter of 126 mm, the applied power is 500 W, the mixed gas of argon (Ar) and nitrogen gas ($N_2$) has a composition ratio set to 80:20 (volume ratio: to be abbreviated as a nitorgen content of 20 volume % herebelow), and the mixed gas pressure is 3 mTorr.

Subsequently, there is prepared a target for a magnetic film constituted with terbium, iron, and cobalt with a composition ratio set to 22:70:8 (number of atoms), and then under the same sputtering conditions as described above, there is formed a magnetic film 15 with a film thickness of about 800 angstrom on a surface of the protective film 13a.

Next, by adopting the similar sputtering conditions to those applied to the protective film 13a, on a surface of the magnetic film 13, there is produced a protective film 13b having a film thickness of about 1000 angstrom, thereby attaining the recording medium associated with the embodiment 19.

Measurement of C/N Ratio

There is conducted a measurement of the C/N ratio on the recording medium of the embodiment 19 produced through the procedure above such that a recording operation is carried out under the conditions that a wavelength of a light used for a write operation is set to 830 nm, the rotary speed is 1800 r.p.m., the duty is 33%, the recording frequency is set to 3.70 MHz, and the recording power is 7 mW; thereafter, a read operation is conducted under conditions that the read power is set to 1.6 mW and the bandwidth is 30 kHz, thereby measuring the C/N ratio.

As a result, a C/N ratio of 49.9 dB is obtained for the recording medium associated with the embodiment 19 in which te protective films are manufactured by use of a target of barium titanate ($BaTiO_3$) in the mixed gas with a composition ratio of nitrogen set to 20 volume %.

Corrosion Resistivity Test

In the corrosion resistivity test, the recording medium related to the embodiment 19 is loaded with information in advance so as to be allowed then to stand for 200 hours under conditions that the recording medium is kept retained at 60° C. and that the relative humidity is set to 80%. Thereafter, the corrosion resistivity of the recording medium is evaluated depending on a result of a measurement effected to attain a ratio of damaged information in the loaded information (an error rate) and the result of the measurement of the C/N ratio.

As a result, there are obtained an error rate of about $3 \times 10^{-5}$ and a C/N ratio of 49.9 dB, which is identical to the value developed before the corrosion resistivity test.

Measurement of Refractive Index

For the measurement of the refractive index, under the depositing conditions above, there is manufactured a sample in which a protective film with a film thickness of 2000 angstrom is formed on a surface of a silicon wafer so as to measure the refractive index n with a wavelength of 633 nm by use of an ellipsometer.

As a result, there is attained a refractive index n of 2.75 of the nitride of barium titanate produced through the sputtering effected in a mixed gas with a composition ratio of nitrogen set to 20 volume %.

COMPARISON EXAMPLE 2

For the recording medium associated with the comparison example 2, a sample is produced under the same conditions as for the embodiment 19 excepting that only argon is used in place of the mixed gas of argon and nitrogen in the protective film forming process.

Measurement of C/N Ratio

Also for the recording medium associated with the comparison example 2, the C/N ratio is measured through the same procedure as for the embodiment 19.

As a result, a C/N ratio of 48.0 dB is obtained for the recording medium associated with the comparison example 2.

Corrosion Resistivity Test

In the corrosion resistivity test, the recording medium related to the comparison example 2 is also allowed to stand for 200 hours under the corrosion resistivity test conditions identical to those applied to the embodiment 19 so as to evaluate the corrosion resistivity depending on the results of the measurements of the error rate and the C/N ratio.

As a result, there are obtained an error rate of about $3 \times 10^{-5}$ and a C/N ratio of 48.0 dB, which is equal to the value developed before the corrosion resistivity test.

Measurement of Refractive Index

Also for the measurement of the refractive index of the protective film material related to the comparison example 2, under the depositing conditions as those of the embodiment 19, there is manufactured a sample so as to measure the refractive index n with a wavelength of 633 nm by use of an ellipsometer.

As a result, there is attained a refractive index n of 2.25 for the nitride of barium titanate produced through the sputtering effected onto the target of barium titanate ($BaTiO_3$) only in an argon gas with a composition ratio of nitrogen set to 0 volume %.

As can be seen from a comparison between the embodiment 19 and the comparison example 2, by using as the protective film material the nitride of barium titanate (grown in a mixed gas with a composition ratio of nitrogen content set in 20 volume %), the refractive index n is further increased by 0.5 as compared with that developed by the compound of barium titanate; moreover, there has not been detected any deterioration in the corrosion resistivity.

EMBODIMENT 20

Next, description will be given of an embodiment in a case where a magneto-optical recording medium inlcudes, like in the case of the embodiment 19, a protective film constituted with a nitride of barium titanate (BaTiOxNy).

Manufacturing Conditions

In this embodiment 20, excepting that there is adopted a target constituted with strontium titanate (SrTiO$_3$) in place of a target of barium titanate (BaTiO$_3$), a recording medium is manufactured under the same conditions as those of the embodiment 19 in which the protective forming process is effected by use of a mixed gas of argon and nitrogen with a nitrogen content set to 20 volume %.

Measurement of C/N Ratio

There is conducted a measurement of the C/N ratio on the recording medium of the embodiment 20 produced through the procedure applied to the embodiment 19.

As a result, a C/N ratio of 49.7 dB is obtained for the recording medium associated with the embodiment 20 in which the protective film depositing is conducted with a target of strontium titanate (SrTiO$_3$) in the mixed gas with a composition ratio of nitrogen set to 20 volume %.

Corrosion Resistivity Test

The corrosion resistivity test is also conducted for the recording medium of this embodiment in the same fashion as for the embodiment 19.

As a result, after the recording medium of the embodiment 20 is allowed to stand under the corrosion resistivity test conditions for 200 hours, there are obtained an error rate of about $3 \times 10^{-5}$ and a C/N ratio of 49.7 dB, which is equal to the value obtained prior to the corrosion resistivity test.

Measurement of Refractive Index

Also for the measurement of the refractive index, like in the case of the embodiment 19, there is produced a sample in which a protective film is formed on a surface of a silicon wafer so as to measure the refractive index n with a wavelength of 633 nm by means of an ellipsometer.

As a result, a refractive index n of 2.73 is obtained for the nitride of barium titanate produced through the sputtering effected onto a target of strontium titanate (SrTiO$_3$) in a mixed gas with a nitrogen content set to 20 volume %.

COMPARISON EXAMPLE 3

A sample of the recording medium associated with the comparison example 3 is produced under the same conditions as for the embodiment 20 excepting that only argon is used in place of the mixed gas of argon and nitrogen in the protective film manufacturing process.

Measurement of C/N Ratio

Also for the recording medium associated with the comparison example 3, the C/N ratio measurement is carried out through the same procedure as for the embodiments 19 and 20.

As a result, a C/N ratio of 47.5 dB is attained for the recording medium associated with the comparison example 3.

Corrosion Resistivity Test

In the corrosion resistivity test, the recording medium related to the comparison example 3 is also allowed to stand for 200 hours under the corrosion resistivity test conditions used for the embodiments 19 and 20 so as to evaluate the corrosion resistivity depending on the results of the measurements of the error rate and the C/N ratio.

As a result, there are obtained an error rate of about $3 \times 10^{-5}$, which is similar to that of the embodiment 20 and a C/N ratio of 47.5 dB, which is equal to the value developed before the corrosion resistivity test.

Measurement of Refractive Index

For the measurement of the refractive index of the protective film material related to the comparison example 3, under the depositing conditions similar to those of the embodiment 20, there is also manufactured a sample so as to measure the refractive index n with a wavelength of 633 nm by use of an ellipsometer.

As a result, there is attained a refractive index n of 2.22 for the compound of strontium titanate produced through the sputtering effected onto the target of strontium titanate (SrTiO$_3$) only in an argon gas with a composition ratio of nitrogen set to 0 volume %.

As can be seen from a comparison between the embodiment 20 and the comparison example 3, through adoption of the nitride of strontium titanate as the protective film material, the refractive index n is further improved by 0.5 as compared with that developed by the compound of strontium titanate; moreover, there has not been detected any deterioration in the corrosion resistivity.

EMBODIMENT 21

Description will next be given in a similar fashion of an embodiment in a case where a magneto-optical recording medium includes a protective film constituted with a mixed crystal of nitrogen compound of strontium titanate (SrTiO$x$N$y$) and nitrogen compound of barium titanate (BaTiO$x$N$y$).

Manufacturing Conditions

In this embodiment 21, excepting that a target employed is constituted with a mixed crystal of barium titanate (BaTiO$_3$) and strontium titanate (SrTiO$_3$) with the constitution ratio is set to 1:1, a recording medium is manufactured under the same condition as for the embodiments 19 and 20 in which the protective film forming process is effected by use of a mixed gas of argon and nitrogen with the ratio of nitrogen set to 20 volume %.

Measurement of C/N Ratio

In a measurement of the C/N ratio on the recording medium of the embodiment 21, there is also adopted the procedure applied to the embodiment 19.

As a result, a C/N ratio of 49.7 dB is obtained for the recording medium associated with the embodiment 21 in which the protective film depositing is achieved with a target constituted with a mixed crystal of barium titanate (BaTiO$_3$) and strontium titanate (SrTiO$_3$) in the mixed gas with the nitrogen content set to 20 volume %.

Corrosion Resistivity Test

Also for the recording medium of the embodiment 21, the corrosion resistivity test is conducted in the same fashion as for the embodiment 19.

As a result, after the recording medium of the embodiment is allowed to stand under the corrosion resistivity test conditions for 200 hours, there are developed an error rate of about $3 \times 10^{-5}$ and a C/N ratio of 49.7 dB, which is identical to the value obtained before the corrosion resistivity test.

Measurement of Refractive Index

Also for the measurement of the refractive index, like in the case of the embodiments 19 and 20, there is produced a sample in which a protective film is formed on a surface of a silicon wafer, thereby measuring the refractive index n with a wavelength of 633 nm by use of an ellipsometer.

As a result, there is attained a refractive index n of 2.74 for the protective film material including a mixed crystal of a nitrogen compound of strontium titanate (SrTiO$x$N$y$) and a nitrogen compound of barium titanate (BaTiO$x$N$y$) produced through the sputtering effected onto a target of the mixed crystal above in a mixed gas with a nitrogen content set to 20 volume %.

COMPARISON EXAMPLE 4

There is manufactured a sample of the recording medium associated with the comparison example 4 under the same conditions as for the embodiment 21 excepting that only argon is used in place of the mixed gas of argon and nitrogen in the protective film manufacturing process.

Measurement of C/N Ratio

Also for the recording medium associated with the comparison example 4, the C/N ratio measurement is conducted through the same procedure as for the embodiments 19 and 21.

As a result, there is obtained a C/N ratio of 48.0 dB for the recording medium associated with the comparison example 4.

Corrosion Resistivity Test

In the corrosion resistivity test, the recording medium related to the comparison example 4 is similarly allowed to stand for 200 hours under the corrosion resistivity test conditions described in conjunction with the embodiments 19 and 21 so as to evaluate the corrosion resistivity depending on the results of the measurements of the error rate and the C/N ratio.

As a result, there are obtained an error rate of about $3 \times 10^{-5}$, which is similar to that of the embodiment 21 and a C/N ratio of 48.0 dB, which is identical to the value developed prior to the corrosion resistivity test.

Measurement of Refractive Index

For the measurement of the refractive index of the protective film material related to the comparison example 4, under the depositing conditions similar to those of the embodiments 19 and 21, there is also manufactured sample so as to measure the refractive index n with a wavelength of 633 nm by use of an ellipsometer.

There is attained, as a result, a refractive index n of 2.24 for the protective film material including a mixed crystal of a compound of strontium titanate and a compound of barium titanate produced through the sputtering effected onto a target of a mixed crystal of barium titanate (BaTiO$_3$) and strontium titanate (SrTiO$_3$) in a gas only including argon with a nitrogen content set to 0 volume %.

As will be indicated through a comparison between the embodiment 21 and the comparison example 4, by adopting the protective film material including a mixed crystal of a nitrogen compound of strontium titanate and a nitrogen compound of barium titanate according to the present invention, the refractive index n is further improved by 0.5 as compared with that developed by the protective film material comprising a mixed crystal of a compound of strontium titanate and a compound of barium titanate; moreover, any deterioration has not been found in the corrosion resistivity.

In the description of the embodiments 19-21, the mixed gas of argon and nitrogen employed to manufacture protective film materials as features of the respective embodiments contains 20 volume % of nitrogen. In consequence, with reference to the drawings, description will next be given of results of the refractive index measurements achieved on a plurality of samples produced under the conditions in which only the nitrogen content of the mixed gas is changed.

Figure 7:
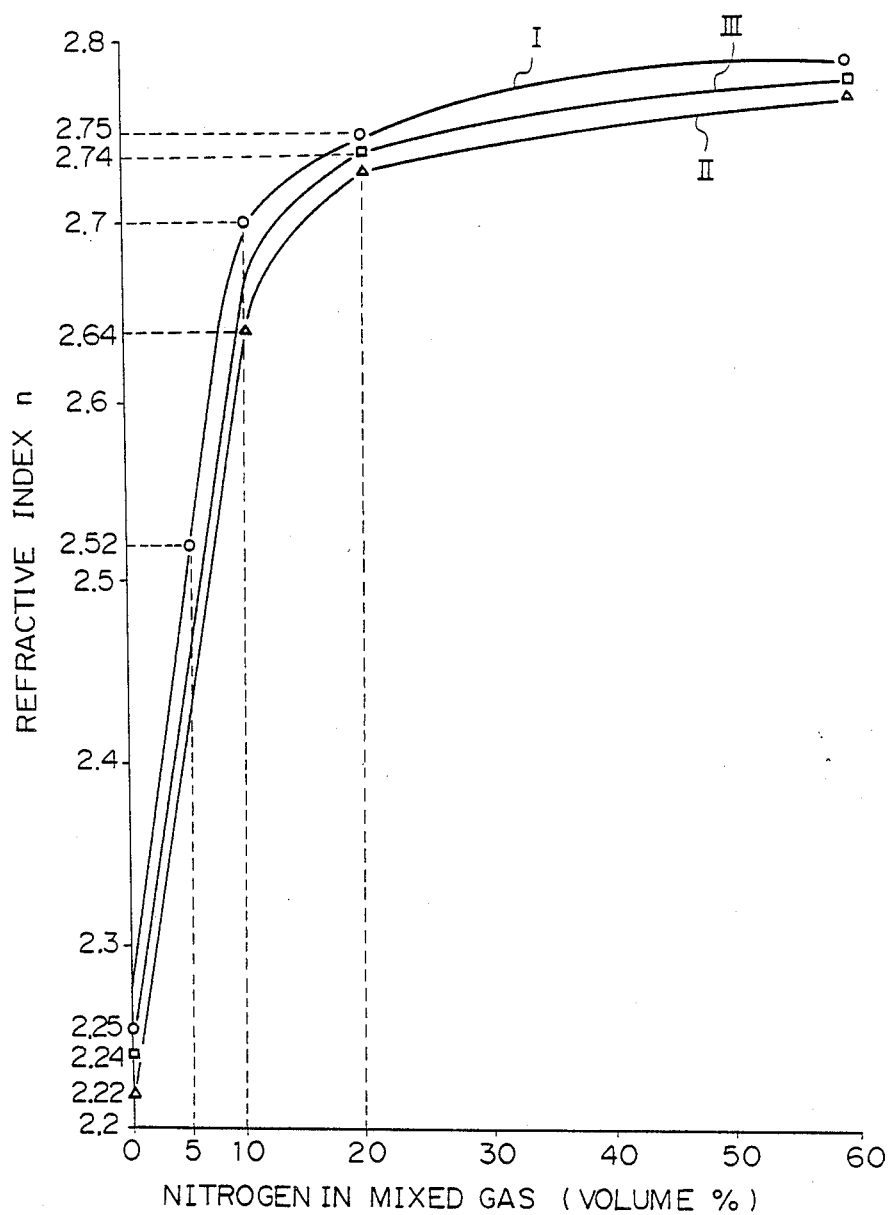
FIG. 7 is a graph showing characteristic curves for understanding the embodiment according to the present invention in which the ordinate and the abscissa respectively represent the refractive index n and the ratio (volume %) of nitrogen in the sputtering atmosphere.

FIG. 7 is a graph showing characteristic curves for explaining the results of the refractive index measurements in which the ordinate and the abscissa respectively indicate a refractive index n and the composition ratio (volume %) of nitrogen in the mixed gas. In this graph, curves I–III respectively represent results associated with a nitrogen compound of barium titanate, a nitrogen compound of strontium titanate, and a mixed crystal constituted with a nitrogen compound of barium titanate and a nitrogen compound of strontium titanate.

First, as indicated by the curve I, the compound of barium titanate grown under the condition of the nitrogen content set to 0 volume % develops a value of 2.25 for a refractive index n as described in the comparison example 2. When compared with this result, it is found that the value of the refractive index n becomes to be greater in the cases where the method according to the present invention is applied so as to increase the nitrogen content in the mixed gas.

For example, when the nitrogen content is set to 5 volume %, a value of 2.52 is attained for the refractive index n, which implies that the refractive index is considerably increased only by adding a small amount of nitrogen. Furthermore, in the protective film materials produced by further increasing the nitrogen ratio, there are developed refractive indexes of 2.70 and 2.75 in cases of the nitrogen contents set to 10 and 20 volume %, respectively.

For the increase in the refractive index recognized in association with the increase in the nitrogen content, there is found a tendency that an equilibrium state appears on a boundary in a range of the nitrogen content from 10 to 20 volume %. For example, in a nitrogen compound of barium titanate with the nitrogen content set to 60 volume %, there is attained a value of about 2.79 for the refractive index. According to the known sputtering technology, the film growing speed is lowered as the nitrogen content becomes to be greater; and hence, in this embodiment, there is not produced a sample under the condition of a nitrogen content exceeding 60 volume %. However, paying attention only to the effect of the increase in the refractive index, even when the nitrogen content exceeds the above volume, it can be expected that the similar effect is attained.

Next, as can be recognized from the curve II, the compound of strontium titanate created under the condition of the nitrogen content set to 0 volume % develops a value of 2.24 for a refractive index n as described in the comparison example 3. In contrast thereto, in the cases where the method according to the present invention is applied so as to increase the nitrogen content in the mixed gas, like in the case of the curve I, it is recognized that the value of the refractive index n becomes to be greater.

Like in the case of the barium titanate, also in the case of strontium titanate, it is seen that the refractive index is considerably increased only by adding a small amount of nitrogen. For example, for the nitrogen compounds of the strontium titanate respectively associated with the nitrogen contents set to 10 and 20 volume %, there are developed refractive indexes of 2.64 and 2.74. In addition, for the increase in the refractive index found in association with the increase in the nitrogen content, like in the case of the curve I, there is recognized a tendency that an equilibrium state appears in the similar fashion. For example, in a protective film material related to the nitrogen content set to 60 volume %, there is attained a value of about 2.78 for the refractive index.

In consequence, also in a case of the results associated with strontium titanate represented with the curve II, like in the case of the results related to barium titanate represented by the curve I, if attention is paid only to the effect of the increase in the refractive index, even when the nitrogen content exceeds the above value, it can be expected that the equivalent effect is attained.

In addition, also in the case of the nitrogen compound associated with the curve III in which it is considered that the protective film is constituted with a mixed crystal of the nitrogen compounds associated with the curves I and II, it is recognizable that the increase in the refractive index is attained as the nitrogen content becomes to be greater.

Description has been given in detail of the embodiments according to the present invention with reference to the samples of recording media produced under the various conditions. Next, description will be given of relationships between the sample manufacturing methods and the compositions of the protective films produced according to the methods above.

Of the embodiments above, for the recording media associated with the embodiments 1, 5, and 9, there has been adopted a known sputtering technology to form the protective films. In addition, also in the recording media produced by use of the method according to the present invention, as can be seen from the results of the characteristic measurements, there is developed substantially an identical composition in the protective films of the recording media associated with the embodiments 1-18.

Furthermore, for the recording media associated with the embodiments 19-21, the protective films are manufactured in a mixed gas including argon as an inert gas and nitrogen, which is expencted to positively react with a compound of titanate.

In the element constitutions above, for such metal elements as strontium, barium, and titanium, a constitution thereof may be determined by use of a chemical analysis technology employing, for example. Auger effect; however, in a case of a compound of titanate, owing to a composition including oxygen which is easily changed to a gas component, it is difficult to strictly determine the constitution.

However, as known from, for example, pages 55-77 of "Theory of Yuudentairon" written by Shoten Oka and published from Gendai Kohgakusha, in substances of titanate represented as MTiO$x$ (M indicates a metal element) produced as a eutectic metal of MO and TiO$_{x-1}$, the composition of substance of titanate (MTiO$x$) can be attained by averaging the complex refractive indexes associated with MO and TiO$_{x-1}$, respectively. In addition, it has been known f or the substances of titanate that as the value of X becomes to be close to three, the extinction coefficient k approximates zero. In more detail, it has been known that a titanate produced from titanium monoxide (TiO) and the metal oxide (MO) absorbs a light, namely, develops a extinction coefficient k other than 0; whereas, a titanate obtained from titanium dioxide (TiO$_2$) and the metal oxide is transparent, namely, has an extinction coefficient k of 0.

Based on the optical characteristics described above, the composition of the protective films related to the embodiments 1-18 can be calculated so as to attain the value X in a range of $2.7 \leq X \leq 3.0$.

As described before, in substances of titanate represented as MTiO$x$ (M indicates a metal element) produced as a eutectic metal of MO and TiO$_{x-1}$, the composition of substance of titanate (MTiO$x$) can be attained by averaging the complex refractive indexes associated with MO and TiO$_{x-1}$, respectively.

In FIG. 7, from the fact that as the quantity of nitrogen included in mixed gas becomes to be more, the refractive index n associated with the compound of titanate is increased, it is recognizable that nitrogen is not included as a gas component in the protective films produced by sputtering the compounds of titanate in an atmosphere included with nitrogen gas.

In consequence, based on these points, the protective films manufactured by adopting the fabricating method in accordance with the present invention are considered to include either one or a mixed crystal of a nitrogen compound of strontium titanate (SrTiO$x$N$y$) and a nitrogen compound of barium titanate (BaTiO$x$N$y$) (where, $0<X<3; 0<Y<3$) depending on the compositions of the respective targets.

Description has been given in detail of the embodiments according to the present invention; however, it is to be understood that the present invention is not restricted only by these embodiments.

For example, in the description of the embodiments above, although argon is adopted as the sputtering gas in the method according to the embodiments, the similar effect is possibly attained by use of other inert gas.

In addition, as a structure of the magneto-optical recording media associated with the embodiments, there has been shown a constitution haivng the film relationships of FIG. 1; however, the magneto-optical recording medium according to the present invention does not develop the effect only owing to the particular film relationships. For example, there can be attained the similar effect even when the medium is constituted by adding other constituent elements.

Furthermore, the embodiments above have been described in conjunction with cases where the magnetic film is constituted with terbium, iron, and cobalt, Tb-Fe-Co, the present invention is not restricted by the structure of the magnetic film, namely, it is possible to employ various kinds of RE-TM alloys.

Moreover, in the description above, as for the mixed crystal of the nitrogen compound of barium titanate and the nitrogen compound of strontium titanate associated with a protective film characterising the present invention, the target employed to manufacture the protective film has a composition of barium and strontium with the ratio thereof set to 1:1. However, the element content ratio between these two elements may be arbitrarily changed in a suitable fashion when manufacturing the protective film by use of the mixed crystal above.

It is to be understood that the materials, positional relationships, numerical conditions, and other particular conditions described above may be arbitrarily and suitably changed and modified with respect to the design within the scope and spirit of the present invention.

As can be seen from the description, according to the magneto-optical recording medium in accordance with the present invention, the protective films of the medium include either one or a mixed crystal of a compound of strontium titanate (SrTiO$x$) and a compound of barium titanate (BaTiO$x$) (where, $2.7 \leq X \leq 3.0$). With this provision, as compared with a recording medium having a conventional protective film, it is possible to implement the higher refractive index and the lower extinction coefficient; moreover, the corrosion resistivity is not deteriorated in the recording media manufactured in accordance with the present invention.

In addition, in the magneto-optical recording media in accordance with the present invention, the protective films are constituted with either one or a mixed crystal of a nitrogen compound of strontium titanate (SrTiO$x$N$y$) and a nitrogen compound of barium titanate (BaTiO$x$N$y$) (where, $0 < X < 3$; $0 < Y < 3$), which enables the refractive index to be increased and which prevents the corrosion resistivity from being deteriorated.

Furthermore, in the method of manufacturing the magneto-optical recording media in accordance with the present invention, a protective film depositing process is implemented by simultaneously conducting a sputtering operation on a film forming target and a composition adjusting target respectively including the predetermined materials, thereby fabricating the recording media in an easy fashion.

Moreover, according to the method of manufacturing the magneto-optical recording media in accordance with the present invention, a protective film depositing is formed by conducting a sputtering operation on a film forming target including the predetermined materials above in a mixed atmosphere containing oxygen, thereby enabling the recording media to be easily produced.

Furthermore, in the method of manufacturing the magneto-optical recording media in accordance with the present invention, by adopting the two methods above at the same time, the production of the recording media is facilitated.

In consequence, by applyng the present invention to the practical cases, it is easy to providie a recording medium having the satisfactory characteristics.

Moreover, according to the method of manufacturing the magneto-optical recording media in accordance with the present invention, a protective film depositing operaion is carried out by conducting a sputtering onto a film forming target comprising the predetermined materials above in a mixed atmosphere containing nitrogen, which enables the recording media to be produced in an easy fashion.

In consequence, it is possible, by practically applying the present invention, to obtain a recording medium developing a favorable Kerr effect enhancement associated with a high refractive index and having a high corrosion resistivity; and hence there are provided a magneto-optical recording medium having a high reliability and a method of manufacturing the same.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A magneto-optical recording medium including a metal compound protective film and a magnetic film respectively formed on a substrate, said protective film comprising at least one selected from the group consisting of a compound of strontium titanate (SrTiO$x$), a compound of barium titanate (BaTiO$x$), a nitrogen compound of strontium titanate (SrTiO$x$N$y$), and a nitrogen compound of barium titanate (BaTiO$x$N$y$), wherein the x in the compounds of strontium titanate and barium titanate is $2.7 \leq x \leq 3.0$, and wherein the x and y in the nitrogen compounds of strontium titanate and barium titanate is $0 < x < 3$ and $0 < y < 3$.

2. A magneto-optical recording medium in accordance with claim 1, said protective film comprising a mixed crystal of a compound of strontium titanate (SrTiO$x$) and a compound of barium titanate (BaTiO$x$), where, $2.7 \leq X \leq 3.0$.

3. A magneto-optical recording medium in accordance with claim 1, said protective film comprising a mixed crystal of nitrogen compound of strontium titanate (SrTiO$x$N$y$) and a nitrogen compound of barium titanate (BaTiO$x$N$y$), where, $0 < X < 3$; $0 < Y < 3$.

* * * * *